(12) United States Patent
Murayama et al.

(10) Patent No.: US 11,037,901 B2
(45) Date of Patent: Jun. 15, 2021

(54) SEMICONDUCTOR ELEMENT BONDING APPARATUS AND SEMICONDUCTOR ELEMENT BONDING METHOD

(71) Applicant: TOYOTA JIDOSHA KABUSHIKI KAISHA, Toyota (JP)

(72) Inventors: Hideyuki Murayama, Seto (JP); Satoru Takemoto, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/732,745

(22) Filed: Jan. 2, 2020

(65) Prior Publication Data
US 2020/0235071 A1 Jul. 23, 2020

(30) Foreign Application Priority Data
Jan. 23, 2019 (JP) .............................. JP2019-009530

(51) Int. Cl.
*H01L 23/00* (2006.01)
*H01L 21/66* (2006.01)
(Continued)

(52) U.S. Cl.
CPC ........ *H01L 24/75* (2013.01); *H01L 21/67259* (2013.01); *H01L 22/26* (2013.01);
(Continued)

(58) Field of Classification Search
CPC ......... H01L 24/75; H01L 24/83; H01L 22/26; H01L 21/67259; H01L 2224/75804;
(Continued)

(56) References Cited

U.S. PATENT DOCUMENTS

2009/0008641 A1 1/2009 Michimata et al.
2009/0301769 A1 12/2009 Seppa et al.
(Continued)

FOREIGN PATENT DOCUMENTS

JP 2001-152396 A 6/2001
JP 2008-277769 A 11/2008
(Continued)

*Primary Examiner* — Dung A. Le
(74) *Attorney, Agent, or Firm* — Sughrue Mion, PLLC

(57) ABSTRACT

Provided are a semiconductor element bonding apparatus and a semiconductor element bonding method that do not cause a bonding material to protrude and also ensure adhesion, even when there are variations in a thickness of a semiconductor element or a workpiece and even when there are projections and depressions on surfaces. A semiconductor element bonding apparatus includes disposing means for disposing a workpiece and a semiconductor element at positions facing each other, moving means for moving the workpiece or the semiconductor element in a vertical direction, displacement measuring means for measuring displacement of the workpiece or the semiconductor element in the vertical direction, load measuring means for measuring a contact load between the workpiece and the semiconductor element with the bonding material interposed therebetween, and elastic modulus calculating means for calculating an elastic modulus from results of the measurement by the displacement measuring means and the load measuring means.

6 Claims, 11 Drawing Sheets

(51) Int. Cl.
*H01L 21/67* (2006.01)
*H01L 21/683* (2006.01)

(52) U.S. Cl.
CPC .......... *H01L 24/83* (2013.01); *H01L 21/6838* (2013.01); *H01L 2224/7592* (2013.01); *H01L 2224/75804* (2013.01); *H01L 2224/75824* (2013.01); *H01L 2224/75901* (2013.01); *H01L 2224/831* (2013.01); *H01L 2224/8384* (2013.01); *H01L 2224/83191* (2013.01); *H01L 2224/83908* (2013.01)

(58) Field of Classification Search
CPC ....... H01L 21/6838; H01L 2224/75901; H01L 2224/831; H01L 2224/83191; H01L 2224/83908; H01L 2224/75824
See application file for complete search history.

(56) References Cited

U.S. PATENT DOCUMENTS

| | | | |
|---|---|---|---|
| 2015/0083786 A1* | 3/2015 | Okamoto | H01L 21/67092 228/102 |
| 2018/0114772 A1* | 4/2018 | Krusor | H01L 24/97 |
| 2020/0286854 A1* | 9/2020 | Nakamura | H01L 24/83 |

FOREIGN PATENT DOCUMENTS

| | | |
|---|---|---|
| JP | 2009-250845 A | 10/2009 |
| JP | 2014-040661 A | 3/2014 |

\* cited by examiner

RELATED ART

SEMICONDUCTOR ELEMENT BONDING APPARATUS AND SEMICONDUCTOR ELEMENT BONDING METHOD

CROSS REFERENCE TO RELATED APPLICATIONS

This application is based upon and claims the benefit of priority from Japanese patent application No. 2019-9530, filed on Jan. 23, 2019, the disclosure of which is incorporated herein in its entirety by reference.

BACKGROUND

The present disclosure relates to a semiconductor element bonding apparatus and a semiconductor element bonding method.

A method of bonding a base material to a semiconductor element using a paste-like bonding material containing metal nanoparticles is known. Typical examples of the bonding method include a method for applying a bonding material on a base material to form a coating film, disposing a semiconductor element on the coating film, and then sintering the metal nanoparticles in the bonding material to thereby bond the base material to the semiconductor element.

Japanese Unexamined Patent Application Publication No. 2014-40661 discloses a sintering method including forming a layer of a powder material containing nanoparticles encapsulated with an encapsulating material on an insulating substrate and applying a voltage to the layer of the powder material to dissolve the encapsulating material to thereby sinter the nanoparticles. Japanese Unexamined Patent Application Publication No. 2014-40661 describes a design in which sintering is stopped when power supply to the layer of the powder material increases to a predetermined level due to sintering.

SUMMARY

When a paste of metal nanoparticles is used as the bonding material, the workpiece and the semiconductor element need to be in close contact with the paste. Since the surface of the workpiece and the semiconductor element and the surface of the applied paste have projections and depressions, it is necessary to ensure adhesion by crushing the paste.

FIG. 13 is a cross-sectional view showing an example of a semiconductor element bonding method according to related art. FIG. 13 shows an example of manufacturing a laminate body in which a collector electrode 91, a silver paste 92 which is a bonding material, a semiconductor element 93, a silver paste 94, and a copper spacer 95 are laminated in this order. In the example of FIG. 13, after each layer is laminated, the silver pastes 92 and 94 are crushed by pressing a jig 96 with a space of a certain size to ensure adhesion.

However, in practice, there are variations in thicknesses of the semiconductor element 93 and the copper spacer 95. For this reason, there is a problem that the silver pastes protrude when the respective layers are thick, if the silver pastes are crushed by a jig with a certain size as shown in FIG. 13. When the silver pastes protrude, the silver pastes spread in an unintended part, and insulation may not be ensured. On the other hand, when the respective layers are thin, the adhesion cannot be ensured, which may cause, for example, a reduction in a heat dissipation performance.

The present disclosure solves such a problem and provides a semiconductor element bonding apparatus and a semiconductor element bonding method that do not cause a bonding material to protrude and also ensure adhesion, even when there are variations in a thickness of a semiconductor element or a workpiece and even when there are projections and depressions on surfaces.

An example aspect of the present disclosure is a semiconductor element bonding apparatus including:

disposing means for disposing a workpiece and a semiconductor element at positions facing each other vertically with a bonding material interposed therebetween;

moving means for moving the workpiece or the semiconductor element in a vertical direction;

displacement measuring means for measuring displacement of the workpiece or the semiconductor element in the vertical direction;

load measuring means for measuring a contact load between the workpiece and the semiconductor element with the bonding material interposed therebetween; and elastic modulus calculating means for calculating an elastic modulus from results of the measurement by the displacement measuring means and the load measuring means.

Since the semiconductor element bonding apparatus according to the above example aspect of the present disclosure evaluates the adhesion using the elastic modulus as an index, the adhesion can be evaluated regardless of the shape of the workpiece or the semiconductor element.

The semiconductor element bonding apparatus may further include control means for stopping the movement of the moving means when the elastic modulus is a predetermined value.

By including the control means, the crushing step can be stopped in a state where the workpiece, the semiconductor element, and the bonding material are in close and appropriate contact with each other without excessively crushing the bonding material.

The above semiconductor element bonding apparatus may further include applying means for applying the bonding material to the workpiece or the semiconductor element.

By including the applying means, a series of manufacturing steps from application of the bonding material to bonding can be performed.

The above semiconductor element bonding apparatus may further include electrical resistance measuring means for measuring an electrical resistance between the workpiece and the semiconductor element with the bonding material interposed therebetween.

By including the electrical resistance measuring means, it is possible to reliably detect contact between the bonding material and the semiconductor element.

Another example aspect of the present disclosure is a semiconductor element bonding method including:

preparing a workpiece or a semiconductor element to which a bonding material is applied;

disposing the workpiece and the semiconductor element at positions facing each other vertically with the bonding material interposed therebetween;

detecting contact between the workpiece and the semiconductor element with the bonding material interposed therebetween while bringing the workpiece and the semiconductor element close to each other;

recording displacement ($z_0$) when the contact is detected;

measuring displacement ($z_n$) of the workpiece or the semiconductor element in a vertical direction and a contact load ($f_n$) between the workpiece and the semiconductor element with the bonding material interposed therebetween at predetermined intervals while bringing the workpiece and the semiconductor element close to each other;

calculating an elastic modulus $\Delta f/\Delta z$ from a change in the contact load $\Delta f(=f_n-f_{(n-1)})$ and a difference in the displacement $\Delta z(=z_n-z_{(n-1)})$; and stopping the movement of the workpiece or the semiconductor element when the elastic modulus is within a predetermined range.

Since the semiconductor element bonding method according to the above example aspect of the present disclosure evaluates the adhesion using the elastic modulus as an index, the adhesion can be evaluated regardless of the shape of the workpiece or the semiconductor element.

In the above semiconductor element bonding method, in the stopping of the movement of the workpiece or the semiconductor element, when a crushing amount $(z_n-z_0)$ is less than a predetermined value, the workpiece or the semiconductor element may be made to continue moving even when the elastic modulus is within the predetermined range, while when the crushing amount is within a predetermined range, the movement of the workpiece or the semiconductor element may be stopped.

According to the above configuration, it is possible to more accurately evaluate the adhesion, because not only the elastic modulus but also the crushing amount after the contact detection are used as indices.

In the above semiconductor element bonding method, in the stopping of the movement of the workpiece or the semiconductor element, when the elastic modulus does not fall within the predetermined range even when the crushing amount $(z_n-z_0)$ exceeds the predetermined value, the movement of the workpiece or the semiconductor element may be stopped when the crushing amount exceeds the predetermined value.

According to the above configuration, even when the elastic modulus does not reach the predetermined value for some reason, the apparatus can be stopped appropriately.

According to the present disclosure, it is possible to provide a semiconductor element bonding apparatus and a semiconductor element bonding method that do not cause a bonding material to protrude and also ensure adhesion, even when there are variations in a thickness of a semiconductor element or a workpiece and even when there are projections and depressions on surfaces.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Figure 1:
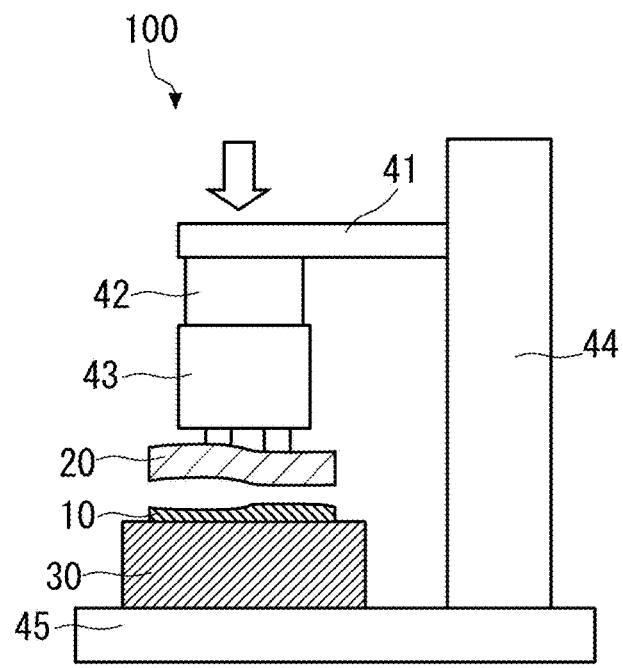
FIG. 1 is a schematic side view of a semiconductor element bonding apparatus according to a first embodiment.

Hereinafter, the present disclosure will be described through embodiments of the present disclosure, but the present disclosure according to the claims is not limited to the following embodiments. In addition, all of the configurations described in the embodiments are not necessarily essential as means for solving the problem.

The following descriptions and drawings are simplified as appropriate in order to clarify the descriptions. Moreover, the scale of each member in the drawings may greatly differ for the sake of descriptions. In particular, projected and recessed shapes on surfaces of a semiconductor element and a bonding material are extremely exaggerated.

First Embodiment

Figure 2A:
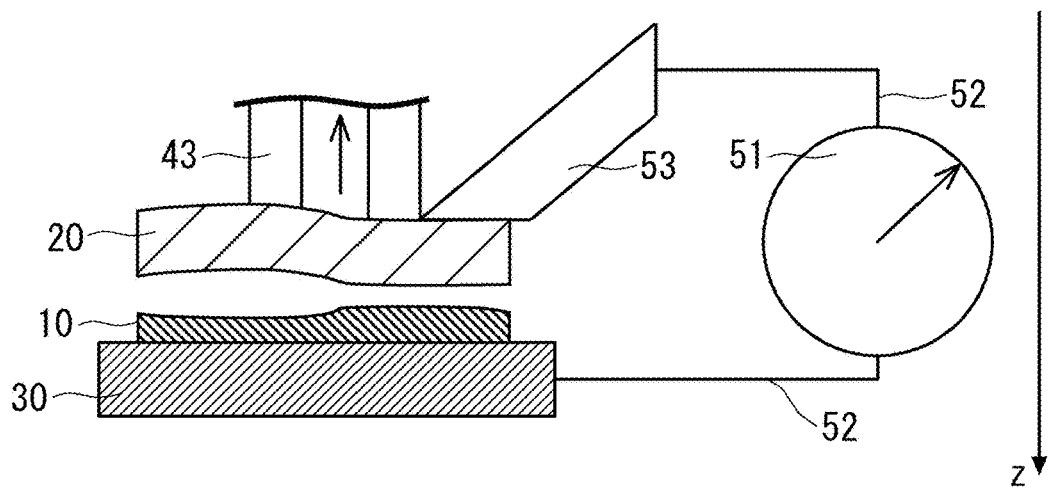
FIG. 2A is a side view showing a state before a bonding material and a workpiece are brought into contact with each other in a first embodiment.

First, a configuration of a semiconductor element bonding apparatus according to a first embodiment will be described with reference to FIGS. 1 and 2A. FIG. 1 is a schematic side view of the semiconductor element bonding apparatus according to the first embodiment. FIG. 2A is a side view showing a state before a bonding material and a workpiece are brought into contact with each other in the first embodiment.

In a semiconductor element bonding apparatus 100 according to the first embodiment shown in FIG. 1, a semiconductor element holding part 43 held by a movable arm 41 and a table 45 serve as disposing means. The workpiece 30 and the semiconductor element 20 (hereinafter also simply referred to as an element) are disposed at positions where they face each other with a bonding material 10 interposed therebetween. In the first embodiment, the semiconductor element holding part 43 includes a mechanism for vacuum-sucking the semiconductor element 20.

In FIG. 1, the movable arm 41 is used as moving means, and the semiconductor element 20 can be moved in a vertical direction (z-axis direction). Displacement measuring means for measuring displacement of the semiconductor element 20 in the vertical direction is not shown in FIG. 1. The displacement measuring means may be means for measuring displacement by directly observing the semiconductor element 20 or means for indirectly measuring the semiconductor element 20 using means for identifying a coordinate in a z-axis direction of the movable arm 41.

In FIG. 1, load measuring means 42 is disposed between the arm 41 and the semiconductor element holding part 43. The load measuring means 42 may be, for example, a load cell. Elastic modulus calculating means (not shown) may include a calculation unit, an input unit, an output unit, a storage unit, and a control unit and may use a general-purpose computer. The elastic modulus calculating means may also serve as a function of control means for stopping a movement of the moving means when an elastic modulus is a predetermined value.

As means for detecting contact, for example, electrical resistance measuring means 51 may be used. As shown in FIG. 2A, the electrical resistance measuring means 51 is electrically connected to each of the semiconductor element 20 and the workpiece 30 via a conducting wire 52, an electrical conductive probe 53, and the like. The electrical resistance measuring means 51 measures an electrical resistance between the semiconductor element 20 and the workpiece 30 with the bonding material 10 interposed therebetween.

Since the semiconductor element bonding apparatus according to the first embodiment evaluates the adhesion using the elastic modulus as an index, the adhesion can be evaluated regardless of the shape of the workpiece or the semiconductor element. This will be described together with details of the semiconductor element bonding method using the semiconductor element bonding apparatus according to the first embodiment.

Figure 5:
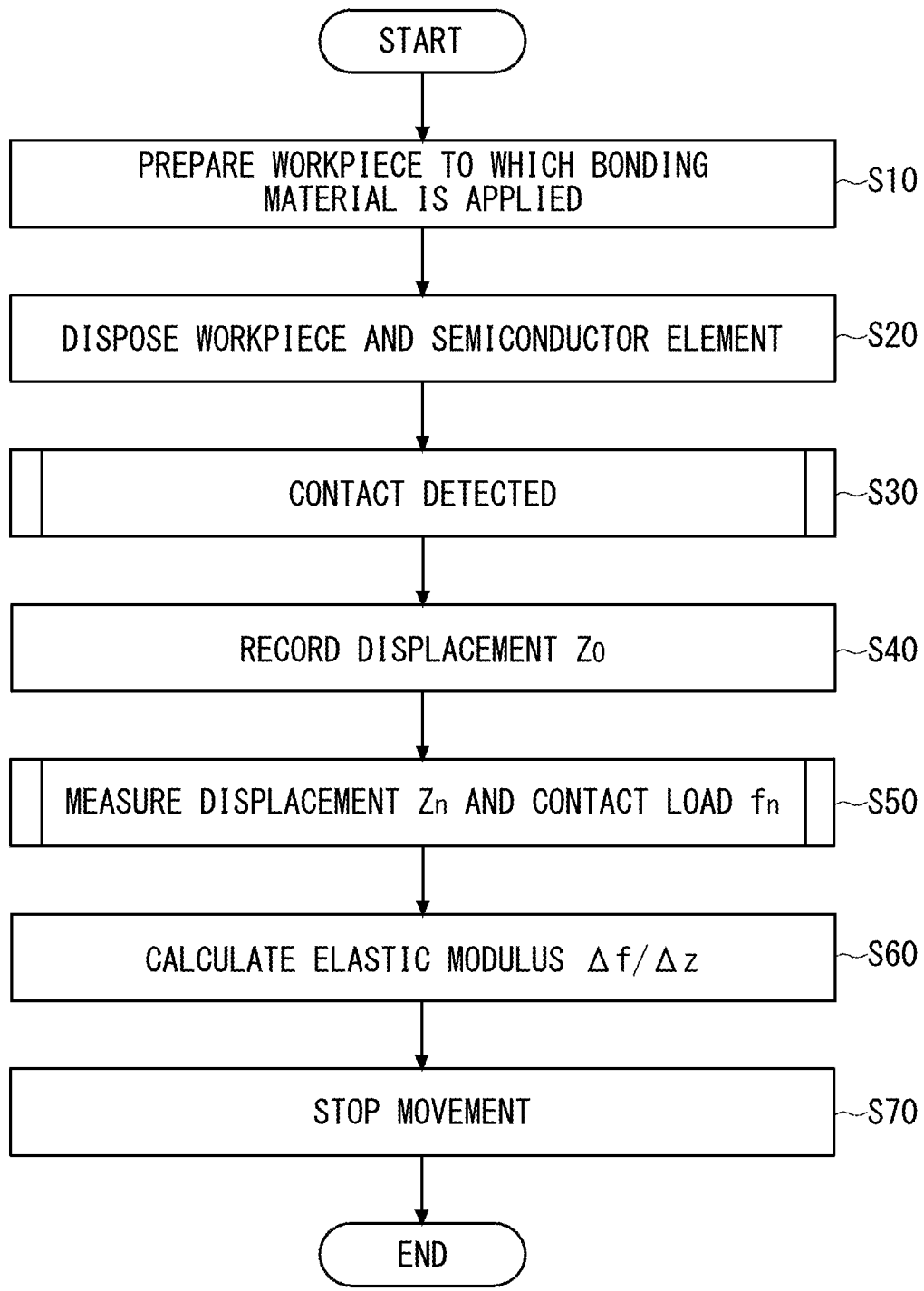
FIG. 5 is a flowchart showing an outline of a semiconductor element bonding method according to the first embodiment.

An outline of the semiconductor element bonding method according to the first embodiment will be described with reference to FIG. 5. FIG. 5 is a flowchart showing an outline of the semiconductor element bonding method according to the first embodiment. The semiconductor element bonding method according to the first embodiment includes:

a step of preparing a semiconductor element and a workpiece to which a bonding material is applied (preparation step: S10);

a step of disposing a workpiece and a semiconductor element at positions facing each other vertically with the bonding material interposed therebetween (disposing step: S20);

a step of detecting contact between the workpiece and the semiconductor element with the bonding material interposed therebetween while bringing the workpiece and the semiconductor element close to each other (contact detection step: S30);

a step of recording displacement ($z_0$) when the contact is detected (displacement recording step: S40), a step of measuring displacement ($z_n$) of the workpiece or the semiconductor element in a vertical direction and a contact load ($f_n$) between the workpiece and the semiconductor element with the bonding material interposed therebetween at predetermined intervals while bringing the workpiece and the semiconductor element close to each other (displacement and contact load measuring step S50), a step of calculating an elastic modulus $\Delta f/\Delta z$ from a change in the contact load $\Delta f(=f_n-f_{(n-1)})$ and a difference in displacement $\Delta z(=z_n-z_{(n-1)})$ (elastic modulus calculating step: S60), and a step of stopping the movement of the workpiece or the semiconductor element when the elastic modulus is within a predetermined range (movement stop step: S70).

In the semiconductor element bonding method according to the first embodiment, first, the contact between the bonding material 10 and the semiconductor element 20 is determined by measuring a decrease in an electrical resistance while bringing the semiconductor element 20 close to the fixed bonding material 10. Next, the semiconductor element 20 is further lowered in the direction of the bonding material 10 to crush projections of the bonding material 10 so that the bonding material 10 is brought into close contact with the semiconductor element 20 while being flattened. Since the elastic modulus increases during this flattening process, the adhesion can be evaluated using the elastic modulus as an index. When the elastic modulus is within a predetermined range, the adhesion is sufficient, and thus the lowering of the semiconductor element 20 is stopped. By sintering the obtained laminate body, a bonded body of the semiconductor element with excellent adhesion can be obtained.

Details of each process will be described below.

In the preparation step (S10), a semiconductor element and a workpiece to which a bonding material is applied are prepared. A semiconductor element is not limited in particular and selected as appropriate according to the use of a product. The semiconductor element is mounted on the workpiece. Examples of the workpiece include an electrode and a heat sink but are not limited thereto.

As the bonding material, a known metal paste containing metal nanoparticles may be used. Although the metal specie of the metal nanoparticles is not limited in particular, examples thereof include silver, copper, etc. An organic protective film for providing dispersibility in a paste and an antioxidant effect may be included in the bonding material.

The application method for applying the bonding material to the workpiece is not limited in particular and can be selected from known printing methods and dispenser application methods as appropriate. Note that the bonding material only needs to be applied to a predetermined part on which the semiconductor element is to be mounted, and in this case, both the printing method and dispenser application method can be preferably used. When the bonding material is applied to the entire surface of the workpiece, the dispenser application is suitable. The same applies to the case in which a bonding material is applied to a semiconductor element, which will be described later.

The application of the bonding material may be performed inside the semiconductor element bonding apparatus according to the first embodiment. In this case, the semiconductor element bonding apparatus includes applying means (not shown) that is in accordance with the printing method or the dispenser application method.

Alternatively, the workpiece to which the bonding material is applied may be prepared using another apparatus or may be prepared using a commercially available product such as a substrate to which the bonding material is applied.

In the disposing step (S20), the workpiece 30 and the semiconductor element 20 are disposed at positions facing each other vertically with the bonding material 10 interposed therebetween. In the example of FIG. 1, the workpiece 30 to which the bonding material 10 is applied is placed on a table 45, and the semiconductor element 20 held by the semiconductor element holding part 43 is disposed on an upper surface of the bonding material 10.

Figure 2B:
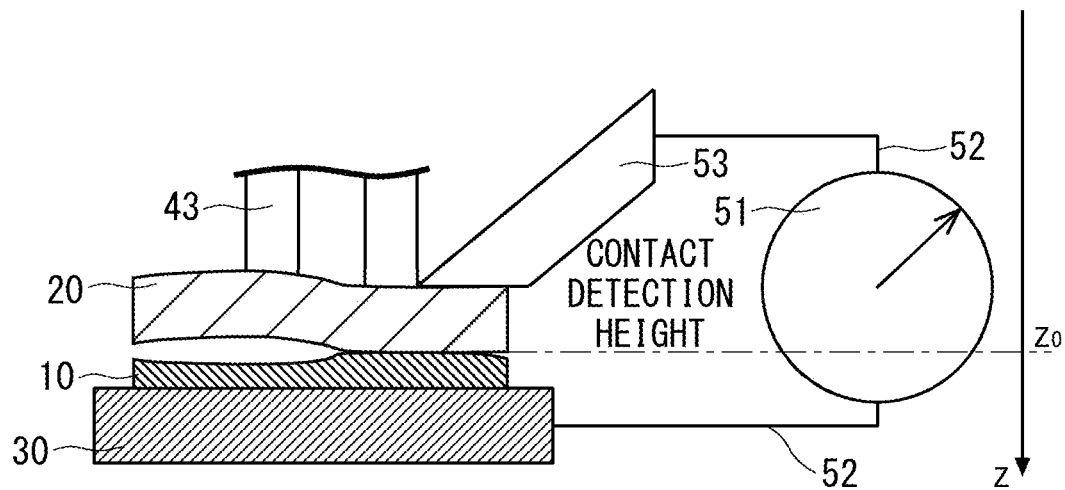
FIG. 2B is a side view showing a state in which the bonding material and the workpiece are brought into contact with each other in the first embodiment.
Figure 2C:
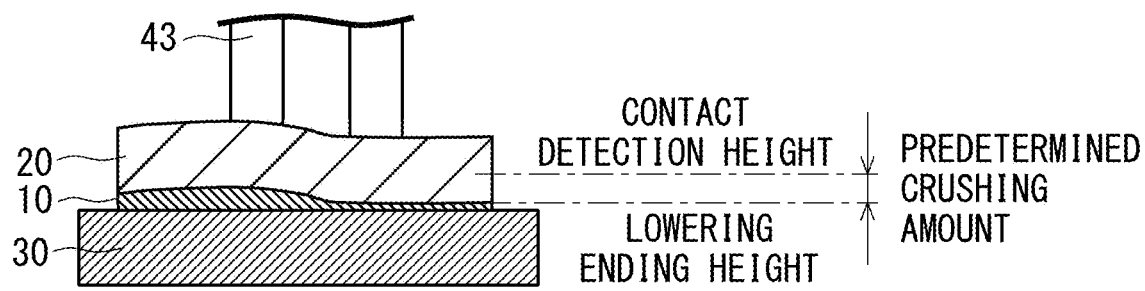
FIG. 2C is a side view showing a state in which the bonding material is crushed to a predetermined crushing amount in the first embodiment.
Figure 3:
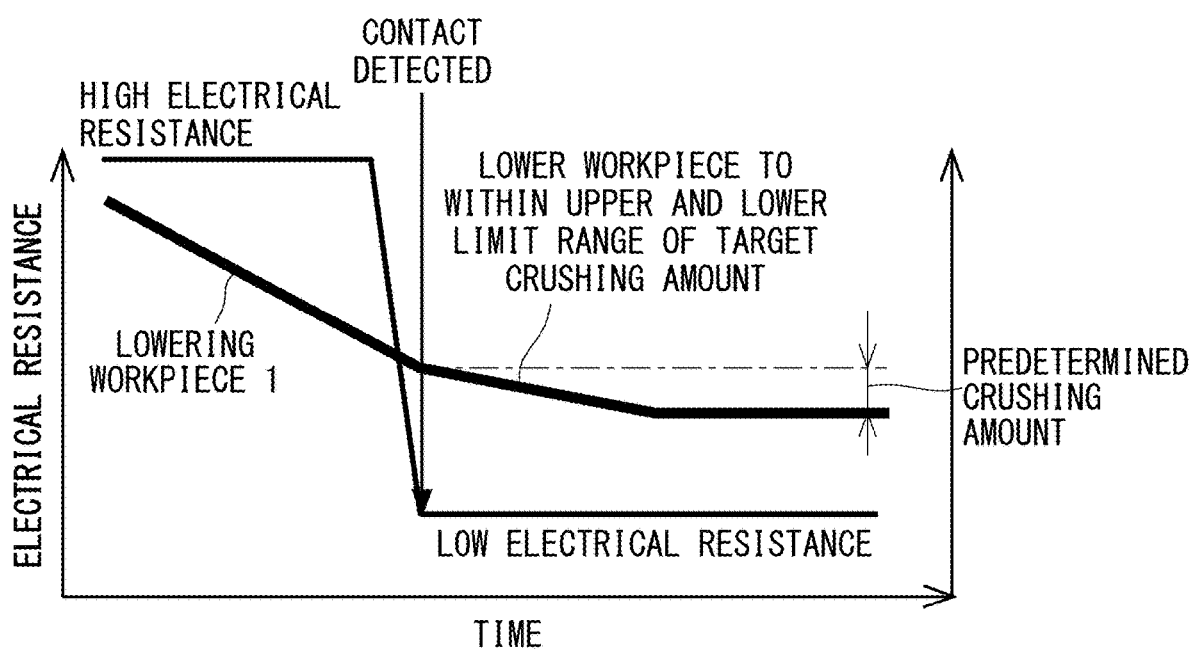
FIG. 3 is a graph showing a change in an electrical resistance between the workpiece and the semiconductor element in FIGS. 2A to 2C.
Figure 6:
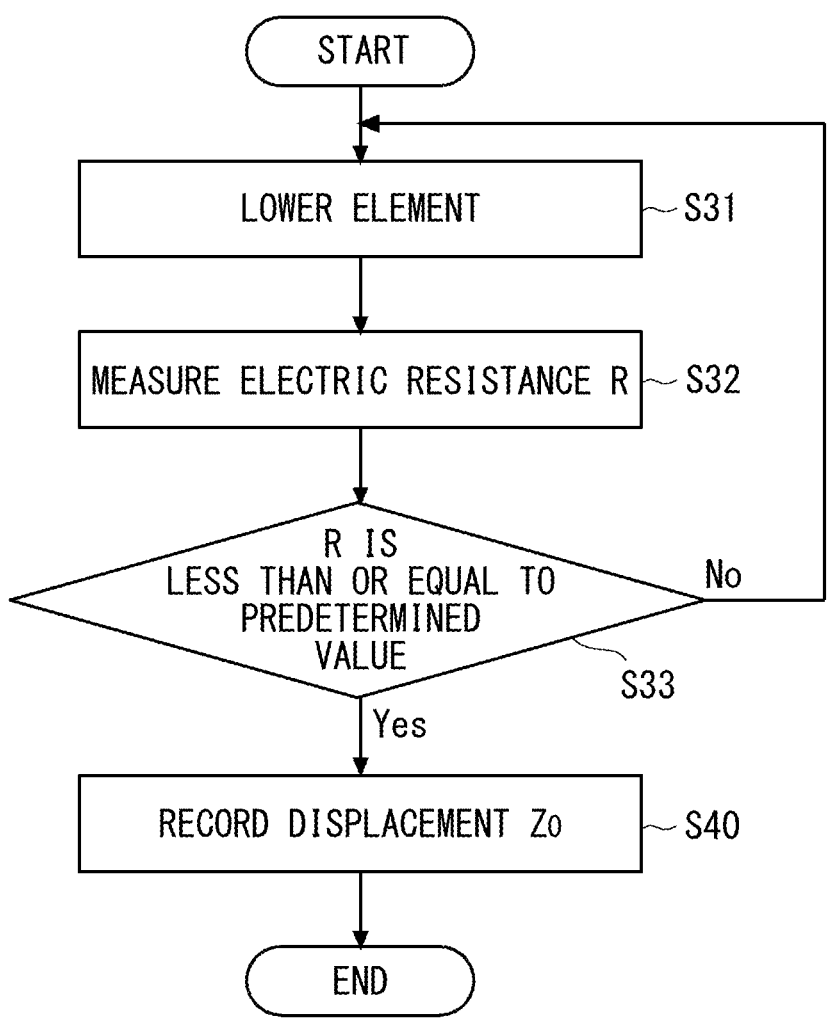
FIG. 6 is a flowchart showing an example from a displacement measuring step (S30) to a displacement recording step (S40)

Next, the contact detection step (S30) will be described with reference to FIGS. 2A to 2C, 3, and 6. In the first embodiment, the contact detection step is performed by measuring an electrical resistance using the electrical resistance measuring means 51. FIGS. 2A to 2C are side views showing the state before the bonding material and the workpiece are brought into contact with each other (FIG. 2A), the state in which the bonding material and the workpiece are brought into contact with each other (FIG. 2B), and the state in which the bonding material is crushed to a predetermined crushing amount (FIG. 2C) in the first embodiment. FIG. 3 is a graph showing a change in the electrical resistance between the workpiece and the semiconductor element in FIGS. 2A to 2C. FIG. 6 is a flowchart showing an example from the contact detection step (S30) to the displacement recording step (S40).

As shown in FIG. 6, in the contact detection step (S30), first, the element 20 is lowered to bring it closer to the bonding material (S31), and an electrical resistance R is measured (S32). Next, it is determined whether the electrical resistance R is less than or equal to a predetermined value (S33). As shown in FIG. 2B, when the element 20 and the bonding material 10 are brought into contact with each other, the electrical resistance R is greatly reduced (see FIG. 3). Thus, when the electrical resistance R is less than or equal to the predetermined value, it is determined that the element 20 is brought into contact with the bonding material 10 (contact detection), and the displacement of the element 20 in the z-axis direction at this time is recorded as $z_0$ (S40). On the contrary, when the electrical resistance R exceeds the predetermined value, the element 20 and the bonding material 10 are not brought into contact with each other. In this case, S31 to S33 are repeated until the element 20 and the bonding material 10 are brought into contact with each other. The predetermined value of the electrical resistance R varies depending on the materials of the bonding material 10, the semiconductor element 20, and the workpiece 30. Thus, a test is conducted in advance with the configuration similar to the configuration to be implemented, and then the predetermined value of the electrical resistance R is set.

Figure 7:
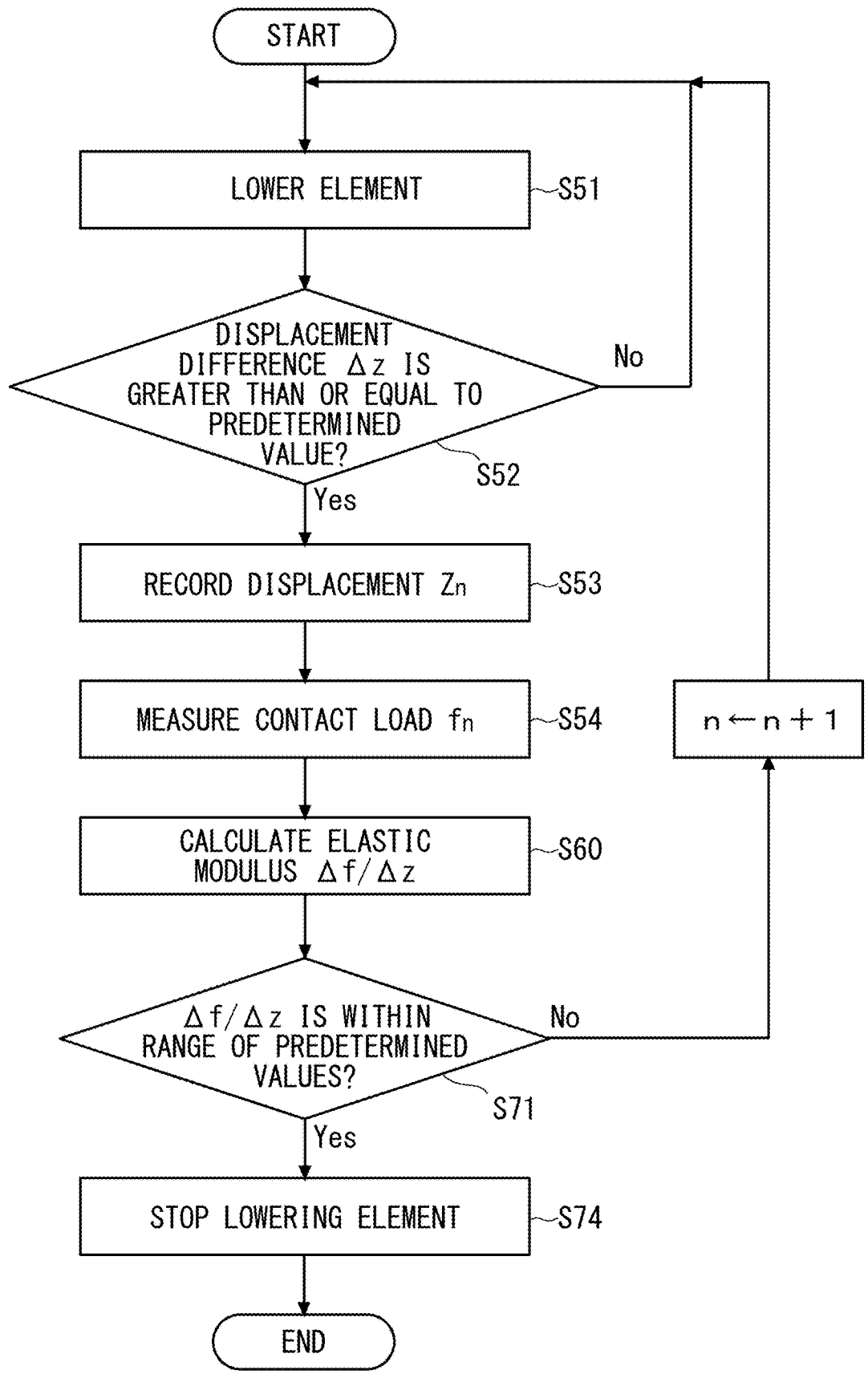
FIG. 7 is a flowchart showing an example from a displacement and contact load measuring step (S50) to a semiconductor element movement stop step (S70) according to the first embodiment.

Next, the displacement and contact load measuring step (S50) and the elastic modulus calculating step (S60) will be described with reference to FIG. 7. FIG. 7 is a flowchart showing an example from the displacement and contact load measuring step (S50) to the semiconductor element movement stop step (S70) in the first embodiment.

As shown in FIG. 7, in the displacement and contact load measuring step (S50), the element 20 is first lowered (S51). At this time, the bonding material 10 is gradually crushed. The displacement of the element 20 is assumed to be z', and it is determined whether a difference in the displacement $\Delta z = z' - z_{(n-1)}$ is greater than or equal to a predetermined value (S52). When $\Delta z$ is greater than or equal to the predetermined value, z' is recorded as $z_n$ (S53). Note that n is an integer greater than or equal to 1. Next, the contact load $f_n$ at $z_n$ is measured by the load measuring means 42 (S54). A change in the contact load $\Delta f (= f_n - f_{(n-1)})$ is calculated from the obtained measured value, and an elastic modulus $\Delta f/\Delta z$ is calculated (S60). Note that $f_0$ is 0. Next, it is determined whether the elastic modulus $\Delta f/\Delta z$ is within a predetermined range (S71). When the elastic modulus is within the predetermined range, it can be determined that the projections of the bonding material are crushed and flattened and that the adhesion is favorable, and thus the lowering of the element is stopped (S74). On the other hand, when the elastic modulus $\Delta f/\Delta z$ is outside a range of the predetermined values (usually less than a lower limit value of the predetermined range), the processes from the displacement and contact load measuring step (S50) to the determination of the elastic modulus (S71) are repeated.

The obtained laminate body is heated and sintered inside the semiconductor bonding apparatus according to this embodiment or in a different heating furnace or the like to thereby obtain a bonded body of the workpiece and the semiconductor element.

Figure 4:
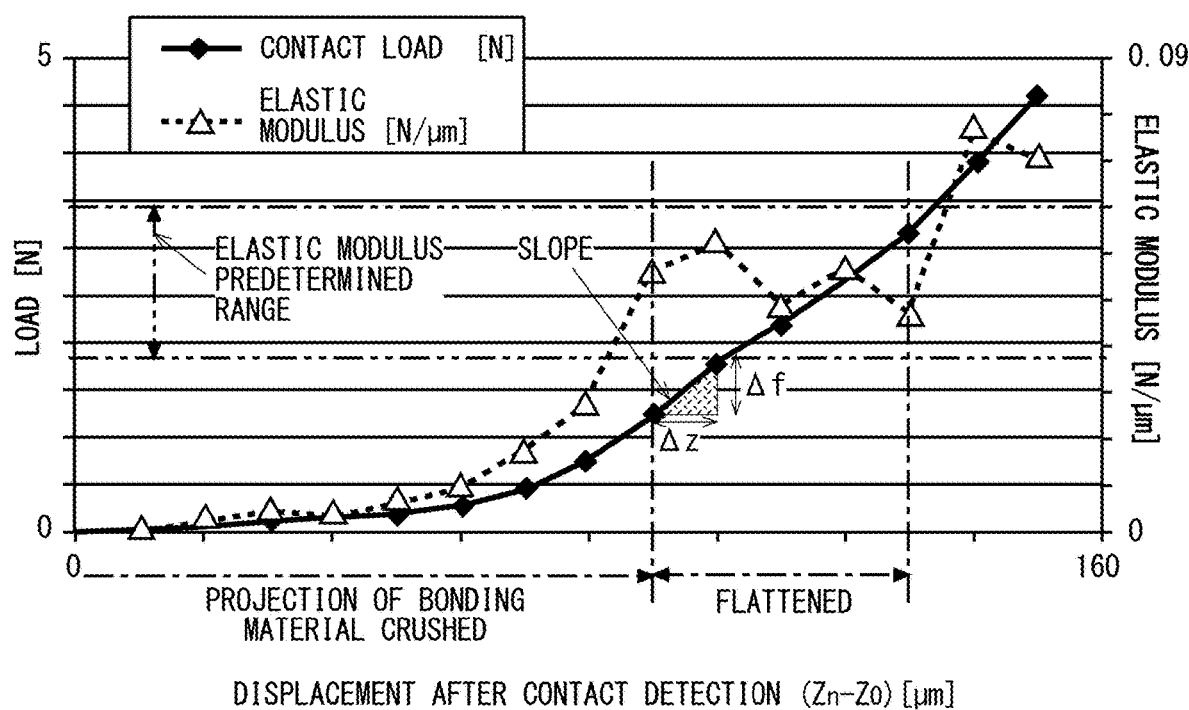
FIG. 4 is a graph showing an example of changes in a contact load and elastic modulus involved in a movement after contact is detected.

Here, the predetermined value of the elastic modulus will be described with reference to FIG. 4. FIG. 4 is a graph showing an example of changes in the contact load and elastic modulus involved in the movement of the element after the contact detection. As shown in FIG. 4, in the region immediately after the contact detection, the projections on the surface of the bonding material are first crushed. At this time, the increase in the contact load is moderate, because the bonding material on the projections moves to the depressions. As the flattening of the bonding material proceeds, the amount of increase in the contact load increases, thereby increasing the elastic modulus. After that, when the bonding material is flattened, the increase in the contact load becomes constant, and thus the change in the elastic modulus becomes small. By setting the elastic modulus in this region to a predetermined value, it is possible to determine a state in which no bonding material protrudes and the adhesion is excellent.

The predetermined value varies depending on, for example, the viscosity of the bonding material, the area of the surface where the bonding material is applied, the state of the projections and depressions on the surface where the bonding material is applied, and the projections and depressions of the semiconductor element. Thus, a test is conducted in advance with the configuration similar to the configuration to be implemented, and then the predetermined value is set.

Figure 10:
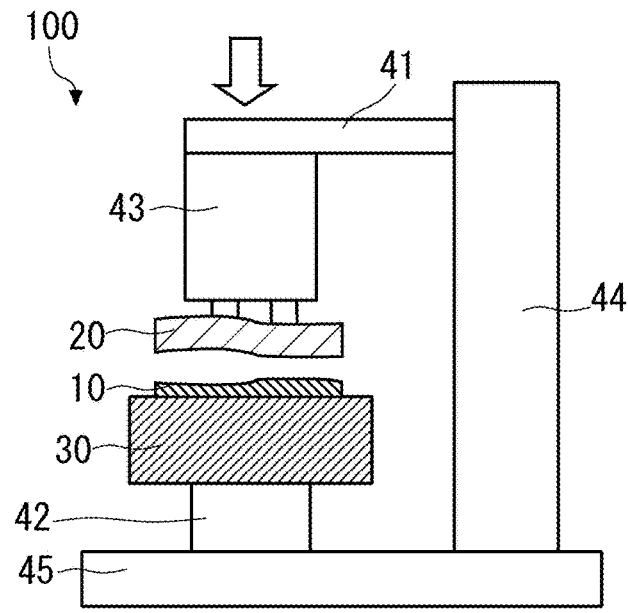
FIG. 10 is a schematic side view showing a modified example of the semiconductor element bonding apparatus according to the first embodiment.

FIG. 10 is a schematic side view showing a modified example of the semiconductor element bonding apparatus according to the first embodiment. A difference between the semiconductor element bonding apparatus of FIG. 10 and the semiconductor element bonding apparatus of FIG. 1 is an arrangement of the load measuring means 42. Even with such a configuration of the semiconductor element bonding apparatus according to the modified example, the semiconductor element bonding method according to the first embodiment can be carried out.

In the semiconductor bonding apparatus and the semiconductor element bonding method according to the first embodiment, the adhesion is evaluated using the elastic modulus as an index. It is thus possible to obtain a bonded body in which no bonding material protrudes and adhesion is excellent even when there are variations in the thicknesses in the semiconductor element and the workpiece and even when there are projections and depressions on the surfaces.

Hereinafter, other embodiments will be described, but descriptions of parts same as those of the first embodiment will be omitted.

Second Embodiment

Figure 8:
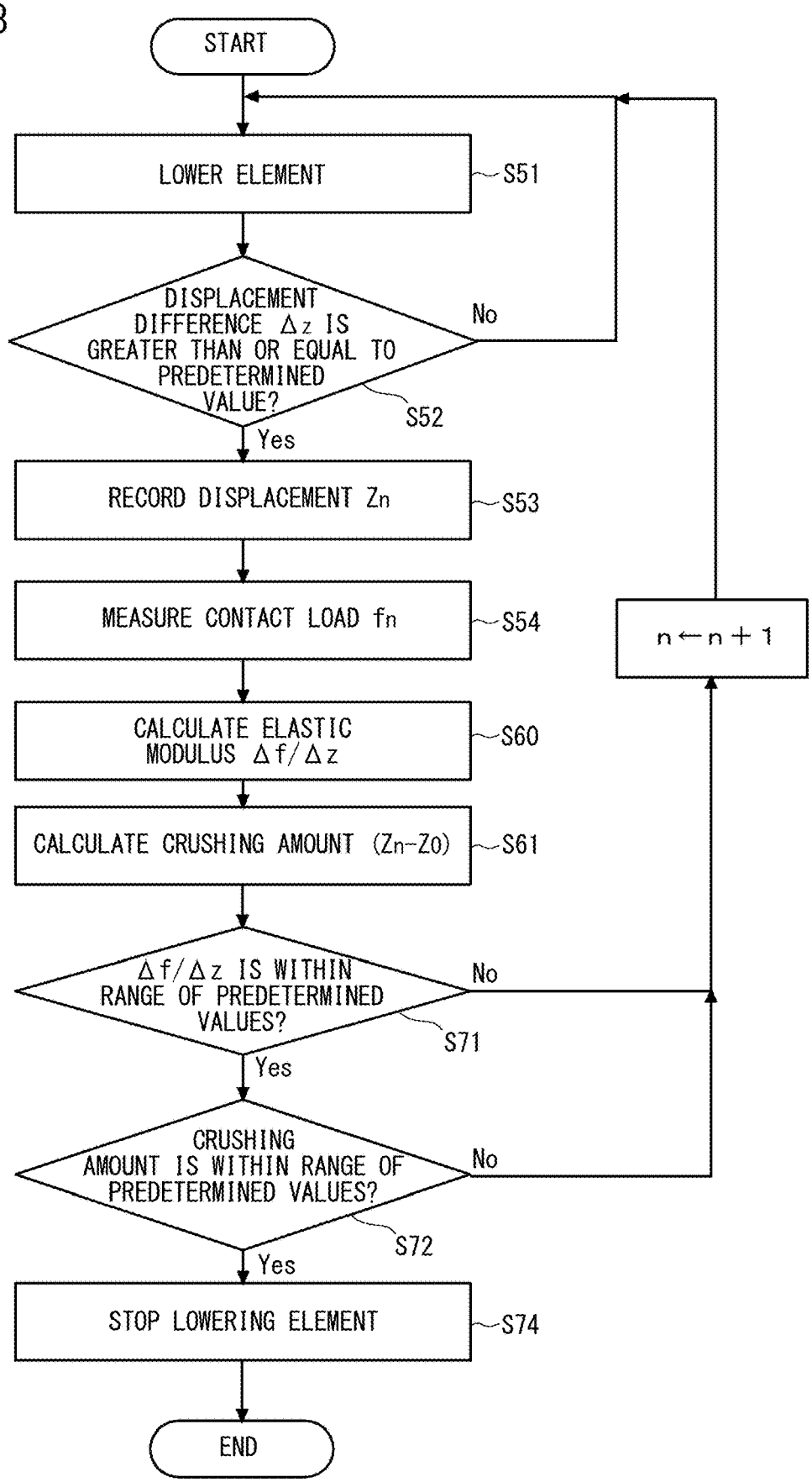
FIG. 8 is a flowchart showing an example from a displacement and contact load measuring step (S50) to a semiconductor element movement stop step (S70) according to a second embodiment.

In a semiconductor element bonding method according to a second embodiment, an evaluation in the semiconductor element movement stop step (S70) differs from that according to the first embodiment, and other processes and apparatus configurations are the same as those according to the first embodiment. A description will be given with reference to FIG. 8. FIG. 8 is a flowchart showing an example from the displacement and contact load measuring step (S50) to the semiconductor element movement stop step (S70) in the second embodiment. Steps S51 to S60 in FIG. 8 are the same as those according to the first embodiment. In the second embodiment, a crushing amount $(Z_n-Z_0)$ is calculated together with the elastic modulus (S61). Even when the elastic modulus is within a range of predetermined values, the lowering of the element is continued if the crushing amount is within the range of the predetermined values (usually less than a lower limit value of the predetermined range). When the crushing amount does not reach the predetermined value, the entire surface may have not been adhered. Thus, the adhesion can be more reliably determined by making a determination by combining the elastic modulus with the crushing amount.

The lower limit value of the crushing amount varies depending on the projections and depressions on the surface where the bonding material is applied and on the surface of the semiconductor element. Thus, a test is conducted in advance with the configuration similar to the configuration to be implemented, and then the lower limit value of the crushing amount is set.

Third Embodiment

Figure 9:
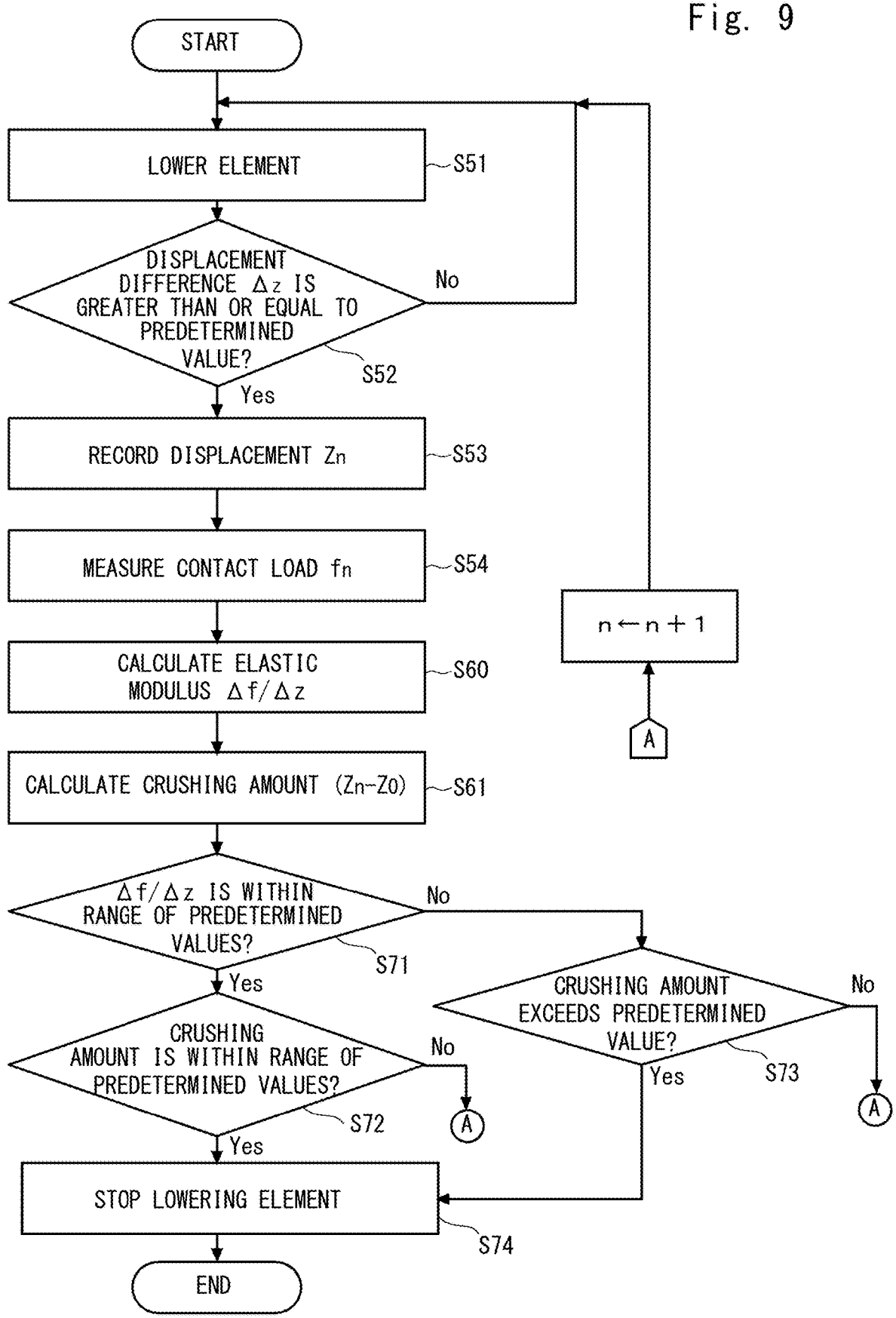
FIG. 9 is a flowchart showing an example from a displacement and contact load measuring step (S50) to a semiconductor element movement stop step (S70) according to a third embodiment.

In a semiconductor element bonding method according to a third embodiment, an evaluation in the semiconductor element movement stop step (S70) differs from that according to the first and second embodiments, and other processes and apparatus configurations are the same as those according to the first and second embodiments. A description will be given with reference to FIG. 9. FIG. 9 is a flowchart showing an example from the displacement and contact load measuring step (S50) to the semiconductor element movement stop step (S70) in the third embodiment. The processes of FIG. 9 are same as those in the second embodiment except for S73. In the third embodiment, when the elastic modulus is outside the range of the predetermined values, the crushing amount is determined before the lowering of the element is continued (S73). By this determination, even when the elastic modulus does not reach the predetermined value for some reason, the element can be stopped without continuing to crush the bonding material. This reduces the load applied to the apparatus.

Note that an upper limit value of the crushing amount can be set as appropriate within a range smaller than the thickness of the bonding material.

Fourth Embodiment

Figure 11:
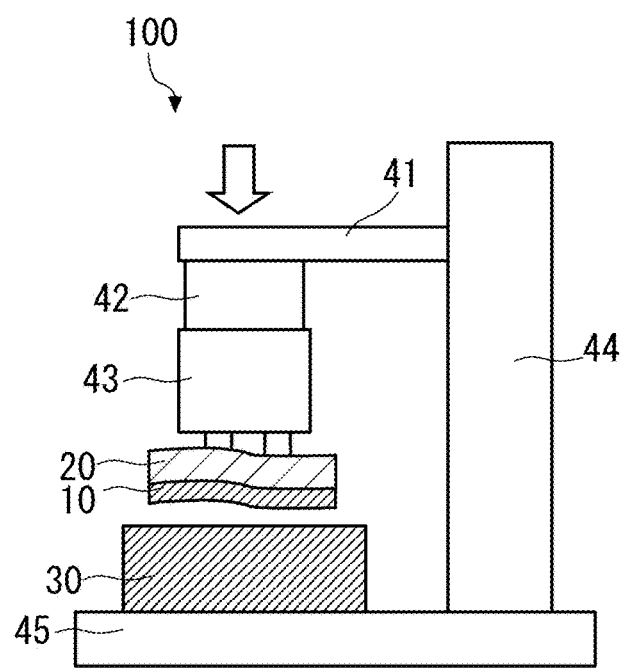
FIG. 11 is a schematic side view of a semiconductor element bonding apparatus according to a fourth embodiment.

FIG. 11 is a schematic side view of a semiconductor element bonding apparatus according to a fourth embodiment. A difference between the fourth embodiment and the first embodiment is that the bonding material 10 according to the fourth embodiment is applied on the semiconductor element 20. In the fourth embodiment, the contact detection in the electrical resistance measuring step (S30) is to detect the contact between the bonding material 10 and the workpiece 30. The semiconductor element bonding method according to the first to third embodiments can be employed as they are.

Fifth Embodiment

Figure 12:
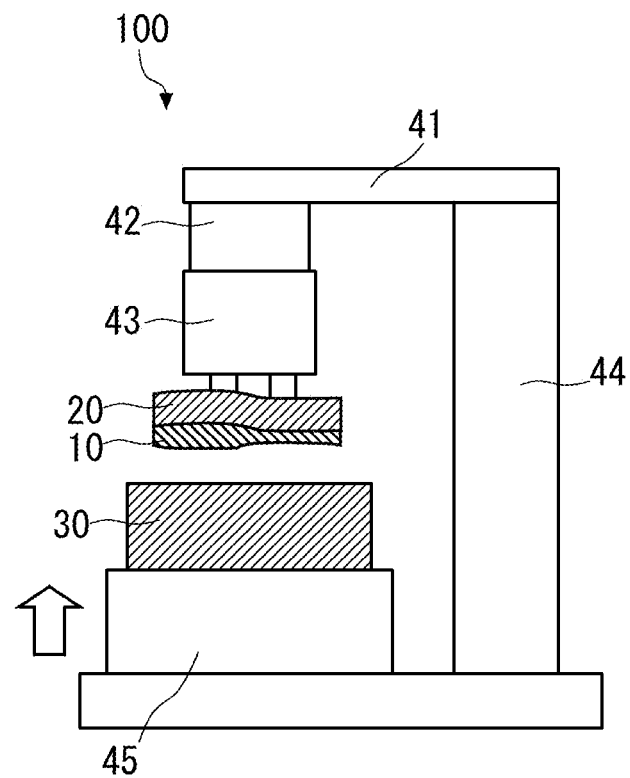
FIG. 12 is a schematic side view of a semiconductor element bonding apparatus according to a fifth embodiment.
Figure 13:
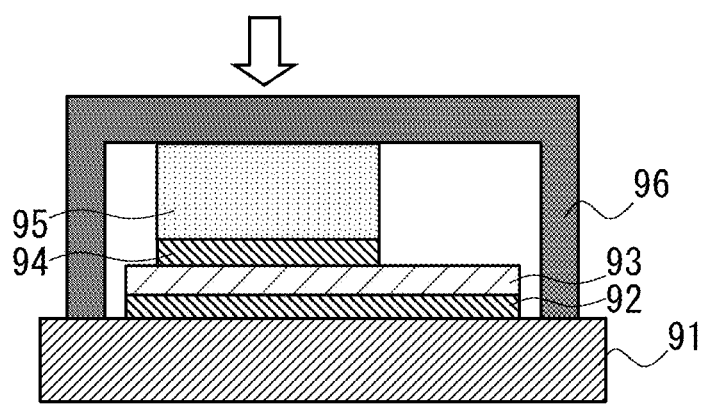
FIG. 13 is a cross-sectional view showing an example of a semiconductor element bonding method according to related art.

FIG. 12 is a schematic side view of the semiconductor element bonding apparatus according to a fifth embodiment. A difference between the fifth embodiment and the first embodiment is that the bonding material 10 according to the fifth embodiment is applied on the semiconductor element 20, that the arm 41 is fixed, and that the table 45 moves in the vertical direction. In the fifth embodiment, the semiconductor element bonding methods according to the first to third embodiments may be employed when the "lowering of the element" (S51) is replaced with "raising of the workpiece" and the "displacement of the element" is replaced by "displacement of the workpiece".

Although not shown, as a modified example of the semiconductor element bonding apparatuses according to the fourth and fifth embodiments, the load measuring means 42 may be disposed on the workpiece side as in the modified example of the semiconductor element bonding apparatus according to the first embodiment.

Other Embodiments

Although not shown, it is also possible to raise the workpiece to which the bonding material is applied to bring it closer to the semiconductor element. Also in this case, the semiconductor element bonding method according to the first to third embodiments can be employed by performing the same replacement as in the fifth embodiment.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A semiconductor element bonding apparatus comprising:
    disposing means for disposing a workpiece and a semiconductor element at positions facing each other vertically with a bonding material interposed therebetween;
    moving means for moving the workpiece or the semiconductor element in a vertical direction;
    displacement measuring means for measuring displacement of the workpiece or the semiconductor element in the vertical direction;
    load measuring means for measuring a contact load between the workpiece and the semiconductor element with the bonding material interposed therebetween;
    elastic modulus calculating means for calculating an elastic modulus from results of the measurement by the displacement measuring means and the load measuring means; and
    applying means for applying the bonding material to the workpiece or the semiconductor element.

2. The semiconductor element bonding apparatus according to claim 1, further comprising control means for stopping the movement of the moving means when the elastic modulus is a predetermined value.

3. The semiconductor element bonding apparatus according to claim 1, further comprising electrical resistance measuring means for measuring an electrical resistance between the workpiece and the semiconductor element with the bonding material interposed therebetween.

4. A semiconductor element bonding method comprising:
    preparing a workpiece or a semiconductor element to which a bonding material is applied;

disposing the workpiece and the semiconductor element at positions facing each other vertically with the bonding material interposed therebetween;

detecting contact between the workpiece and the semiconductor element with the bonding material interposed therebetween while bringing the workpiece and the semiconductor element close to each other;

recording displacement ($z_0$) when the contact is detected;

measuring displacement ($z_n$) of the workpiece or the semiconductor element in a vertical direction and a contact load ($f_n$) between the workpiece and the semiconductor element with the bonding material interposed therebetween at predetermined intervals while bringing the workpiece and the semiconductor element close to each other;

calculating an elastic modulus $\Delta f/\Delta z$ from a change in the contact load $\Delta f(=f_n-f_{(n-1)})$ and a difference in the displacement $\Delta z(=z_n-z_{(n-1)})$; and stopping the movement of the workpiece or the semiconductor element when the elastic modulus is within a predetermined range.

5. The semiconductor element bonding method according to claim 4, wherein in the stopping of the movement of the workpiece or the semiconductor element, when a crushing amount ($z_n-z_0$) is less than a predetermined value, the workpiece or the semiconductor element is made to continue moving even when the elastic modulus is within the predetermined range, while when the crushing amount is within a predetermined range, the movement of the workpiece or the semiconductor element is stopped.

6. The semiconductor element bonding method according to claim 4, wherein in the stopping of the movement of the workpiece or the semiconductor element, when the elastic modulus does not fall within the predetermined range even when the crushing amount ($z_n-z_0$) exceeds the predetermined value, the movement of the workpiece or the semiconductor element is stopped when the crushing amount exceeds the predetermined value.

* * * * *